(12) United States Patent
Fu et al.

(10) Patent No.: US 9,699,942 B1
(45) Date of Patent: Jul. 4, 2017

(54) SERVICEABLE FAN SLED IN A COMPONENT CARRIER

(71) Applicant: Quanta Computer Inc., Taoyuan (TW)

(72) Inventors: Tsung-Chun Fu, Taoyuan (TW); Chen-Chien Kuo, Taoyuan (TW); Yaw-Tzorng Tsorng, Taoyuan (TW); Chao-Jung Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/183,502

(22) Filed: Jun. 15, 2016

(51) Int. Cl.
*H05K 7/20* (2006.01)
*G06F 1/20* (2006.01)

(52) U.S. Cl.
CPC ........... *H05K 7/20727* (2013.01); *G06F 1/20* (2013.01); *H05K 7/20172* (2013.01)

(58) Field of Classification Search
None
See application file for complete search history.

(56) References Cited

U.S. PATENT DOCUMENTS

| | | | |
|---|---|---|---|
| 7,403,390 B2* | 7/2008 | Franz | H05K 7/20727 165/104.33 |
| 7,940,525 B2* | 5/2011 | Letourneau | H05K 7/20172 361/679.48 |
| 8,538,226 B2* | 9/2013 | Makrides-Saravanos | G02B 6/4455 385/135 |
| 8,641,107 B2* | 2/2014 | Wu | G11B 33/128 292/336.3 |
| 8,995,136 B2* | 3/2015 | Kostecka | H05K 7/005 361/679.37 |
| 9,030,827 B2* | 5/2015 | Jau | G06F 1/16 211/49.1 |
| 9,055,689 B2* | 6/2015 | Yu | H05K 5/0226 |
| 9,058,158 B2* | 6/2015 | Chen | G06F 1/20 |
| 9,075,581 B2* | 7/2015 | Stock | G06F 1/20 |
| 9,265,173 B1* | 2/2016 | Jhang | G06F 1/187 |
| 2002/0181197 A1* | 12/2002 | Huang | H05K 7/1421 361/679.39 |
| 2006/0256522 A1* | 11/2006 | Wei | H05K 7/20581 361/695 |
| 2009/0154092 A1* | 6/2009 | Chen | G06F 1/187 361/679.51 |

(Continued)

*Primary Examiner* — Xanthia C Cunningham
(74) *Attorney, Agent, or Firm* — Nixon Peabody LLP; Eduardo J. Quinones

(57) ABSTRACT

Component carrier having a chassis, a first component sled engaged with and receivable into the chassis, a fan module mounted at the front of the first component sled, and a second component sled engaged with and receivable into the chassis above the first component sled and rearward of the fan module. The first and second component sled each transitionable between an extended position and a withdrawn position. The extended position having the respective component sled at least partially outside of the chassis and the withdrawn position having the respective component sled substantially received into the chassis. Transition of the first component sled from the withdrawn to the extended position moves the fan module from the chassis but does not move the second component sled while transition of the second component sled from the withdrawn position to the extended position moves the first component sled to the extended position.

15 Claims, 5 Drawing Sheets

(56) References Cited

U.S. PATENT DOCUMENTS

| | | | | |
|---|---|---|---|---|
| 2010/0007252 | A1* | 1/2010 | Liu | H05K 7/1487 312/223.2 |
| 2010/0310225 | A1* | 12/2010 | Anderson | G02B 6/4455 385/135 |
| 2011/0122573 | A1* | 5/2011 | Peng | G06F 1/20 361/679.48 |
| 2012/0114477 | A1* | 5/2012 | Li | F04D 25/0613 415/213.1 |
| 2012/0134113 | A1* | 5/2012 | Lai | H05K 7/20727 361/695 |
| 2013/0188309 | A1* | 7/2013 | Ross | H05K 7/20727 361/679.48 |
| 2013/0342990 | A1* | 12/2013 | Jau | G06F 1/18 361/679.39 |
| 2014/0160666 | A1* | 6/2014 | Peng | H05K 7/1489 361/679.39 |
| 2015/0208543 | A1* | 7/2015 | Chen | H05K 7/1489 361/679.39 |
| 2015/0271943 | A1* | 9/2015 | Peng | H05K 7/1487 361/679.39 |
| 2016/0381836 | A1* | 12/2016 | Hall | H05K 7/20718 361/679.48 |

\* cited by examiner

SERVICEABLE FAN SLED IN A COMPONENT CARRIER

TECHNICAL FIELD

The present disclosure relates to a component carrier, more specifically the present disclosure relates to a component carrier having a serviceable fan module.

BACKGROUND

Current server racks are configured to receive component carriers having a plurality of components provide a cooling module rearward of the plurality of components. The server rack can provide serviceability for the components received within the component carrier; however, the cooling module can only be serviced by removing the component carrier from the server rack, thus requiring powering down the component carrier.

SUMMARY OF THE INVENTION

A component carrier having a chassis, a first component sled engaged with and receivable into the chassis, a fan module mounted at the front of the first component sled, and a second component sled engaged with and receivable into the chassis above the first component sled and rearward of the fan module. The first component sled and the second component sled each being transitionable between an extended position and a withdrawn position. The extended position having the respective component sled at least partially outside of the chassis and the withdrawn position having the respective component sled substantially received into the chassis.

Transitioning the first component sled from the withdrawn position to the extended position moves the fan module from the chassis, but does not move the second component sled. Transitioning of the second component sled from the withdrawn position to the extended position also transitions the first component sled to the extended position. When the first component sled is in the extended position, the fan module is accessible from above regardless of the position of the second component sled.

Each of the first component sled and second component sled can be individually transitionable between the extended position and the withdrawn position. The fan module can be couplable with each of the first component sled and the second component sled. The fan module can be configured to receive a plurality of fans. Each of the plurality fans can be hot swappable.

Each of the first component sled and second component sled can be configured to receive a plurality of hard disk drives. The chassis can include a sled auto control configured to detect component failure and identify component failure within the first component sled and the second component sled.

BRIEF DESCRIPTION OF THE DRAWINGS

Various embodiments in accordance with the present disclosure will be described with reference to the drawings, in which.

DETAILED DESCRIPTION

Figure 1:
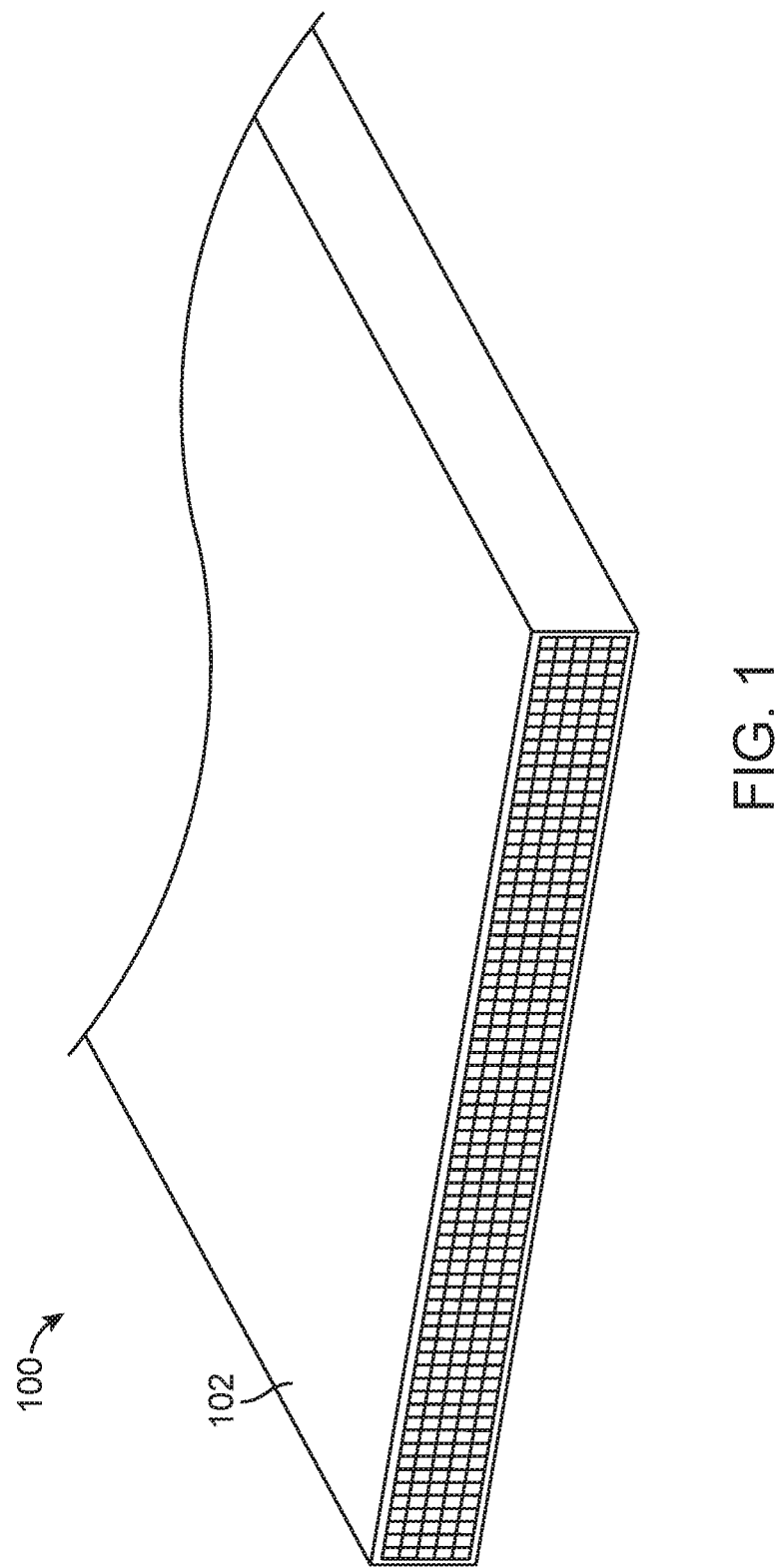
FIG. 1 is an isometric view of an example embodiment of a component carrier in a withdrawn position.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
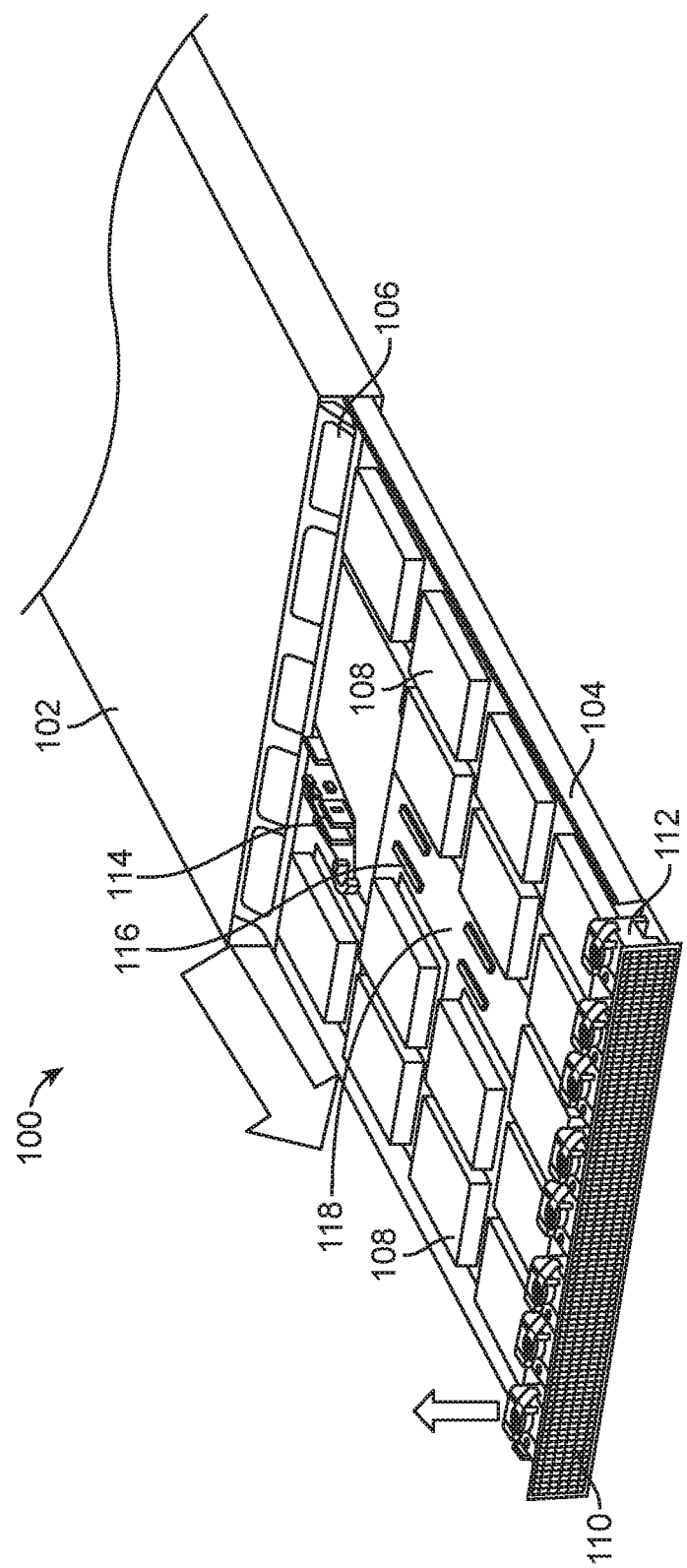
FIG. 2 is an isometric view of an example embodiment of a component carrier having a first component sled with a fan module coupled thereto in an extended position.
Figure 3:
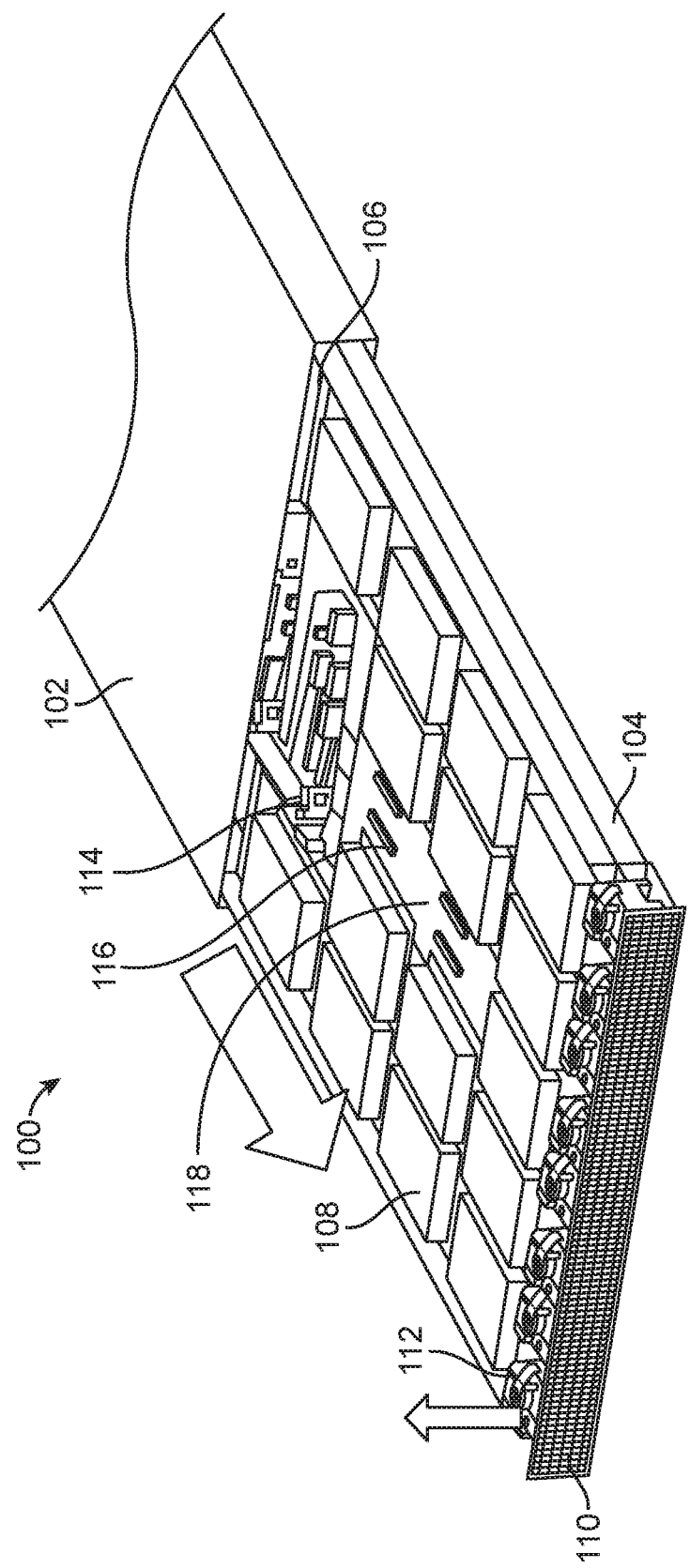
FIG. 3 is an isometric view of an example embodiment of a component carrier having a first component sled and a second component sled with a fan module coupled thereto in an extended position.

The present disclosure relates to a component carrier having a chassis, a first component sled engaged with and receivable into the chassis, a fan module mounted at the front of the first component sled, and a second component sled engaged with and receivable into the chassis above the first component sled and rearward of the fan module. The first and second component sled each transitionable between an extended position and a withdrawn position. The extended position having the respective component sled at least partially outside of the chassis and the withdrawn position having the respective component sled substantially received into the chassis. Transition of the first component sled from the withdrawn to the extended position moves the fan module from the chassis but does not move the second component sled while transition of the second component sled from the withdrawn position to the extended position moves the first component sled to the extended position. One or more component carriers can be received into a server rack assembly FIGS. 1-3 illustrate a component carrier 100 having a chassis 102 configured to receive a first component sled 104 and a second component sled 106. The chassis 102 slidingly receives the first component sled 104 and the second component sled 106. Each component sled 104, 106 can be independent transitioned between a withdrawn position and an extended position.

The first component sled 104 and second component sled 106 are each configured to receive one or more components 108. The one or more components 108 are storage devices, such as hard disk drives and/or solid state drives. In other embodiments, the one or more components 108 can be graphic processing units, computer processing units, or any other electrical component capable of being received within a component sled 104, 106. The invention is not limited to the nature of the components 108

The chassis 102 can include a sled auto controller 114 configured to detect failures of components within the chassis 102. The sled auto controller 114 can determine failure of one or more components 108 within the chassis 102 including, but not limited to, the specific component location among the first component sled 104 and second component sled 106. The sled auto controller 114 can indicate the failed component 108 is in the first component sled 104, the second component sled 106, or there are failed components 108 within both the first component sled 104 and the second component sled 106.

The sled auto controller 114 can include one or more electrically controlled latches 116. The electrically controlled latches 116 can be coupled with the chassis 102 and configured to selectively engage the first component sled 104 and the second component sled 106. The sled auto controller 114 selective engages the electrically controlled latches 116 depending on the location of the detected failure. In at least one embodiment, if the auto sled controller 114 detects a failure in the first component tray 104, the electrically controlled latch 116 is released and only the first component tray 104 is removable from the chassis 102. If the auto sled controller 114 detects a failure in the second component tray 104, the electrically controlled latch 116 can engage and lock the first component tray 104 and second component tray 106 together, thus when removed from the chassis 102 the second component tray 106 and first component tray 104 are removed together.

In other embodiments, the electronically control latches 116 can be two or more latches selectively engageable with the first component tray 104 and the second component tray 106 allowing removable of the first component tray 104, the second component tray 106, or a combination thereof.

The electrically controlled latch 116 can be fed by a central board 118 or from each component tray 104, 106. The central board 118 can be a printed circuit board, a flexible circuit board, or any other known electrical board. The central board 118 can have a processor, microprocessor, storage media, non-transitory storage medium, or any combinatory thereof.

In FIG. 1, the first component sled 104 and the second component sled 106 are in the withdrawn position as substantially received into the chassis 102.

In FIG. 2, the first component sled 104 is in the extended position and the second component sled 106 is in the withdrawn position. The extended position having the respective component sled 104, 106 at least partially outside of the chassis 102.

A fan module 110 is mounted at the front of the first component sled 104. The fan module 110 can receive a plurality of fans 112 or other cooling devices configured to impart air movement through the chassis 102 and first and second component sleds 104, 106. Each of the plurality of fans 112 is individually removable from the fan module 110 during operation of the one or more components 108. Removal of one or more of the plurality of fans 112 can assist with maintenance, repair, or servicing of the component carrier 100 without requiring power down.

The fan module 110 can be accessible when either the first component sled 104 or the second component sled 106 is in the extended position. In FIG. 3, the fan module 110 is accessible when both the first component sled 104 and the second component sled 106 are in the extended position.

In some embodiments, transitioning the second component sled 106 to the extended position also transitions the first component sled 104 to the extended position. If the first component sled 104 is already in the extended position, the second component sled 106 can be transitioned between positions independent of the first component sled 106. In other embodiments, the fan module 110 can be a sled and can be transitionable independent of each component sled 104, 106, with the first component sled 104, with the second component sled 106, or any combination thereof.

Figure 4:
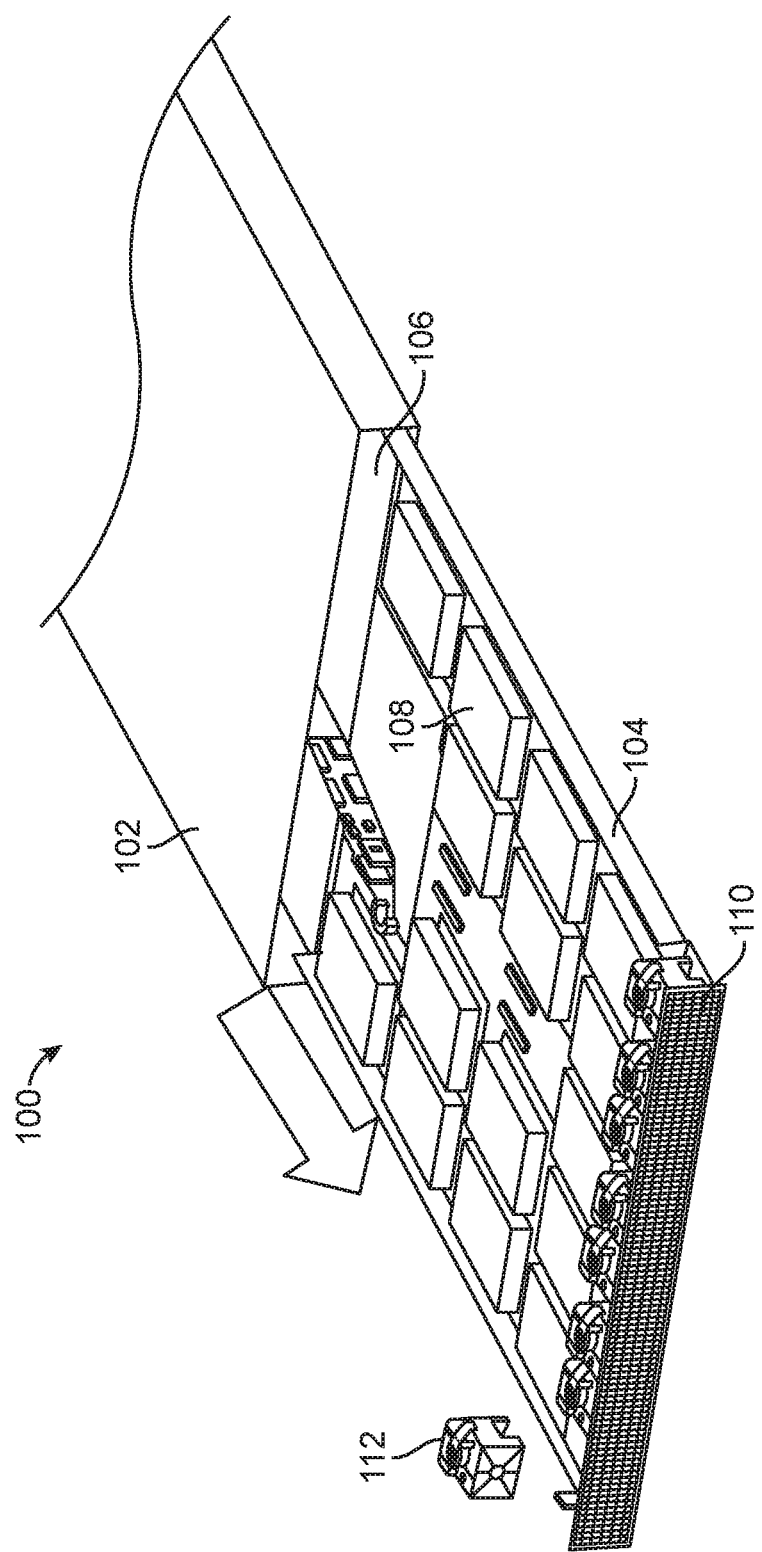
FIG. 4 is an exploded view of example embodiment of a component carrier having a fan removed from a fan module.

FIG. 4 illustrates an exploded view of a component carrier 100 having a plurality of fans 112 received within a fan module 110. As can be appreciated in FIG. 4, the fan module 110 can receive a plurality of fans having eight fans 112. Each of the eight fans 112 can be removed individually while the chassis is in operation. In other embodiments, the plurality of fans 112 can be more or less than eight fans, such as two, three, four, or any number of fans.

The plurality of fans 112 can be coupled with the fan module 110 using tool-less mechanisms such as pre-tensioned clip brackets. The fans 112 can be snapped into and out of the fan module 110 without the use of tools providing quick and easy servicing of the fan module 110.

Figure 5:
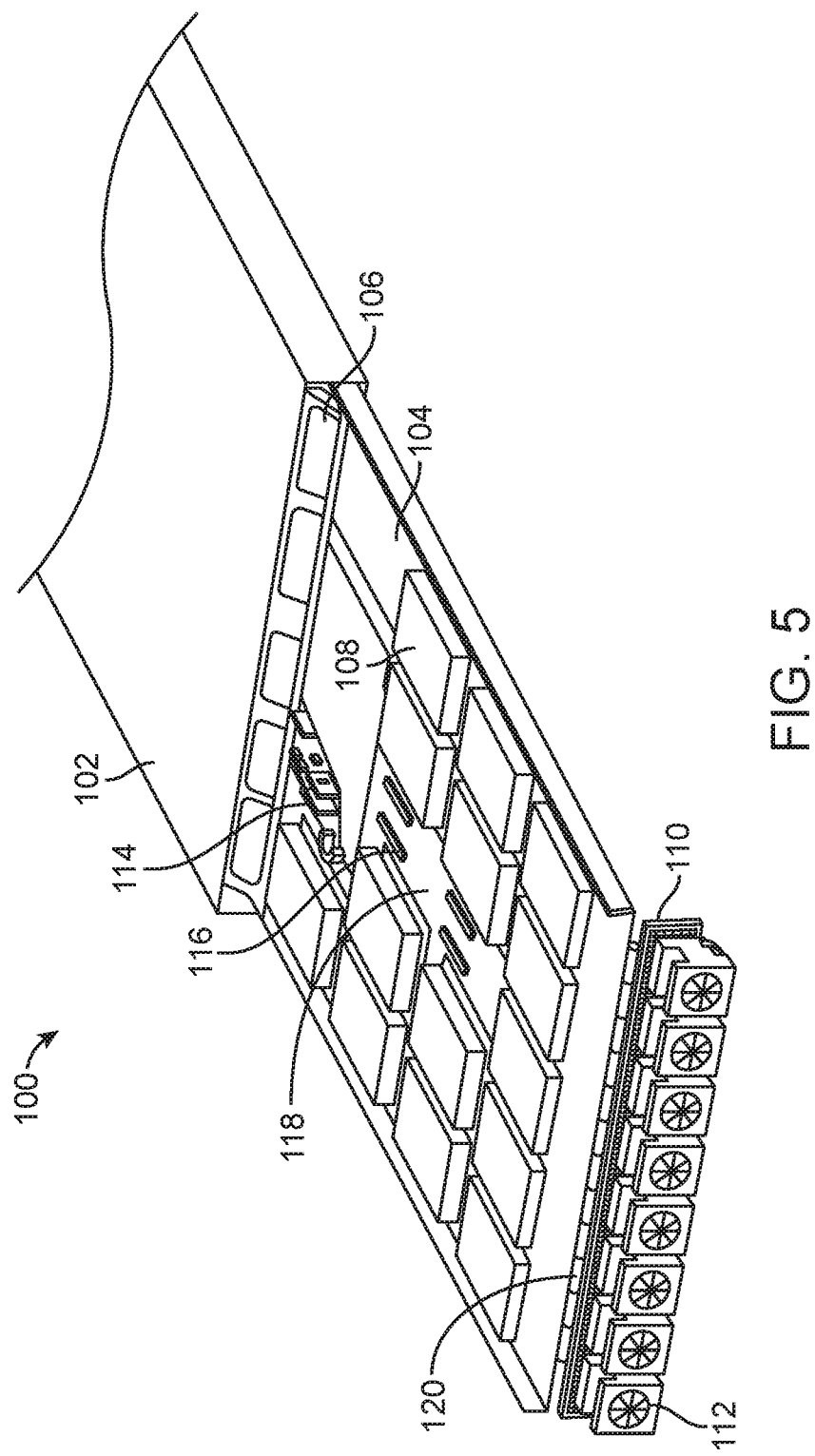
FIG. 5 is an isometric view of an example embodiment of a component carrier having a pivotal fan module.

FIG. 5 illustrates a component carrier 100 having a transitionable fan module 110. The component carrier 100 has a fan module 110 pivotally coupled with the chassis 102, thereby allowing the fan module 110 to displace away from the first component sled 104 and the second component sled 106. Displacement of the fan module 110 can allow transitioning either the first component sled 104 or the second component sled 106 from the withdrawn position to the extended position independent of the other. In the illustrated embodiment, the fan module 110 displaces downward about a front edge of the first component sled 104. In other embodiments, the fan module 110 can be pivotally coupled with either sidewall of the chassis 102, or the front edge of the top surface of the chassis 102. The fan module 110 can be pivotally coupled with the chassis 102 by one or more hinges 120, a pin and receiver arrangement, or any other known pivotal arrangement.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A component carrier comprising:
   a chassis;
   a first component sled engaged with and receivable into the chassis;
   a fan module mounted at a front of the first component sled; and a second component sled engaged with and receivable into the chassis above the first component sled and rearward of the fan module;
   wherein the first component sled and the second component sled are each transitionable between an extended position and a withdrawn position, the extended position having the respective component sled at least partially outside of the chassis and the withdrawn position having the respective component sled substantially received into the chassis; wherein when the first and second sled are in the withdrawn positions:

transition of the first component sled to the extended position moves the fan module from the chassis but does not move the second component sled;

transition of the second component sled to the extended position moves the first component sled to the extended position;

wherein when the first component sled is in the extended position, the fan module is accessible from above regardless of the position of the second component sled.

2. The component carrier of claim 1, wherein each of the first component sled and second component sled is individually transitionable between the extended position and the withdrawn position.

3. The component carrier of claim 1, wherein the fan module is couplable with each of the first component sled and the second component sled.

4. The component carrier of claim 1, wherein the fan module is configured to receive a plurality of fans.

5. The component carrier of claim 4, wherein the plurality fans are hot swappable.

6. The component carrier of claim 1, wherein each of the first component sled and second component sled is configured to receive a plurality of hard disk drives.

7. The component carrier of claim 1, further comprising a sled auto control configured to detect component failure and identify component failure within the first component sled and the second component sled.

8. A server rack assembly comprising:
one or more component carriers, each component carrier having a chassis, the chassis comprising:
a first component sled engaged with and receivable into the chassis;
a fan module mounted at a front of the first component sled; and
a second component sled engaged with and receivable into the chassis above the first component sled and rearward of the fan module;
wherein the first component sled and the second component sled are each transitionable between an extended position and a withdrawn position, the extended position having the respective component sled at least partially outside of the chassis and the withdrawn position having the respective component sled substantially received into the chassis;
wherein when the first and second sled are in the withdrawn positions:
transition of the first component sled to the extended position moves the fan module from the chassis but does not move the second component sled;
transition of the second component sled to the extended position moves the first component sled to the extended position;
wherein when the first component sled is in the extended position, the fan module is accessible from above regardless of the position of the second component sled.

9. The server rack assembly of claim 8, wherein each of the first component sled and second component sled is individually transitionable between the extended position and the withdrawn position.

10. The server rack assembly of claim 8, wherein the fan module is couplable with each of the first component sled and the second component sled.

11. The server rack assembly of claim 8, wherein the fan module is configured to receive a plurality of fans.

12. The server rack assembly of claim 11, wherein the plurality fans are hot swappable.

13. The server rack assembly of claim 8, wherein each of the first component sled and second component sled is configured to receive a plurality of hard disk drives.

14. The server rack assembly of claim 8, further comprising a sled auto control configured to detect component failure and identify component failure within the first component sled and the second component sled.

15. A component carrier comprising:
a chassis;
a first component sled engaged with and receivable into the chassis;
a fan module mounted at a front of the first component sled; and
a second component sled engaged with and receivable into the chassis above the first component sled and rearward of the fan module;
wherein the first component sled and the second component sled are each transitionable between an extended position and a withdrawn position, the extended position having the respective component sled at least partially outside of the chassis and the withdrawn position having the respective component sled substantially received into the chassis; wherein when the first and second sled are in the withdrawn positions:
transition of the first component sled to the extended position moves the fan module from the chassis but does not move the second component sled;
transition of the second component sled to the extended position does not move the first component sled;
wherein when the first component sled is in the extended position, the fan module is accessible from above regardless of the position of the second component sled.

* * * * *